(12) United States Patent
Daley

(10) Patent No.: US 7,233,520 B2
(45) Date of Patent: Jun. 19, 2007

(54) PROCESS FOR ERASING CHALCOGENIDE VARIABLE RESISTANCE MEMORY BITS

(75) Inventor: Jon Daley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 71 days.

(21) Appl. No.: 11/176,884

(22) Filed: Jul. 8, 2005

(65) Prior Publication Data

US 2007/0008768 A1    Jan. 11, 2007

(51) Int. Cl.
*G11C 11/00* (2006.01)
*G11C 11/36* (2006.01)

(52) U.S. Cl. .................. 365/163; 365/148; 365/175
(58) Field of Classification Search ................ 365/163
See application file for complete search history.

(56) References Cited

U.S. PATENT DOCUMENTS

| | | |
|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |

(Continued)

FOREIGN PATENT DOCUMENTS

JP          56126916          10/1981

(Continued)

OTHER PUBLICATIONS

Lankhorst, Martijn, et al, Low-cost and nanoscale non-volatile memory concept for future silicon chips, Apr. 2005, vol. 4, 347-352.*

(Continued)

*Primary Examiner*—Amir Zarabian
*Assistant Examiner*—Michael Weinberg
(74) *Attorney, Agent, or Firm*—Dickstein Shapiro LLP

(57) ABSTRACT

A method of erasing a chalcogenide variable resistance memory cell is provided. The chalcogenide variable resistance memory cell includes a p-doped substrate with an n-well and a chalcogenide variable resistance memory element. The method includes the step of applying to the variable resistance memory element a voltage that is less than a fixed voltage of the substrate. The applied voltage induces an erase current to flow from the p-doped substrate through the n-well and through the variable resistance memory element.

29 Claims, 11 Drawing Sheets

U.S. PATENT DOCUMENTS

| | | |
|---|---|---|
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki et al. |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,541,869 A * | 7/1996 | Rose et al. ................. 365/100 |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki |
| 6,391,688 B1 | 5/2002 | Gonzalez et al. |
| 6,404,665 B1 | 6/2002 | Lowrey et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,426,891 B1 * | 7/2002 | Katori ........................ 365/175 |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowrey |
| 6,507,061 B1 | 1/2003 | Klersy et al. |
| 6,511,862 B2 | 1/2003 | Hudgens et al. |
| 6,511,867 B2 | 1/2003 | Lowrey et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowrey et al. |
| 6,555,860 B2 | 4/2003 | Lowrey et al. |
| 6,563,164 B2 | 5/2003 | Lowrey et al. |
| 6,566,700 B2 | 5/2003 | Xu |
| 6,567,293 B1 | 5/2003 | Lowrey et al. |
| 6,569,705 B2 | 5/2003 | Chiang et al. |
| 6,570,784 B2 | 5/2003 | Lowrey |
| 6,576,921 B2 | 6/2003 | Lowrey |
| 6,586,761 B2 | 7/2003 | Lowrey |
| 6,589,714 B2 | 7/2003 | Maimon et al. |
| 6,590,807 B2 | 7/2003 | Lowrey |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowrey et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowrey et al. |
| 6,671,710 B2 | 12/2003 | Ovshinsky et al. |
| 6,673,648 B2 | 1/2004 | Lowrey |
| 6,673,700 B2 | 1/2004 | Dennison et al. |
| 6,674,115 B2 | 1/2004 | Hudgens et al. |
| 6,687,153 B2 | 2/2004 | Lowrey |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 6,930,909 B2 * | 8/2005 | Moore et al. ............... 365/148 |
| 6,961,277 B2 * | 11/2005 | Moore et al. ............... 365/222 |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |

| | | |
|---|---|---|
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Harshfield et al. |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0156468 A1 | 8/2003 | Campbell et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |
| 2004/0264234 A1 | 12/2004 | Moore et al. |
| 2005/0007852 A1 | 1/2005 | Moore et al. |
| 2005/0201146 A1* | 9/2005 | Moore et al. ............... 365/163 |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |
| WO | WO 2004/084229 | 9/2004 |

OTHER PUBLICATIONS

Hayashi, et al, Polarized Memory Switching in Amorphous Se Film, Japan, J. Appl. Phys. 13 (1974) 1163-1164.*

Machine translation of Bernede, J.C. , Influence du metal des electrodes sur les caracteristiques courant-tension des structures M-Ag2Se-M, 1980, Thin Solid Films, 70, L1-L4.*

Abdel-All, A.; Elshafie,A.; Elhawary, M.M., DC Electric-field Effect-field Effect in Bulk and Thin-film Ge5As38Te57 Chalcogenide Glass, Vacuum 59 (2000) 845-853.

Adler, D.; Moss, S.C., Amorphous Memories and Bistable Switches, J. Vac. Sci. Technol. 9 (1972) 1182-1189.

Adler, D.; Henisch, H.K.: Mott, S.N., The Mechanism of Threshold Switching in Amorphous Alloys, Rev. Mod. Phys. 50 (1978) 209-220.

Afifi, M.A.; Labib, H.H.; El-Fazary, M.H.; Fadel, M., Electrical and Thermal Properties of Chalcogenide Glass System Se75Ge25-xSbx, Appl. Phys. A 55 (1992) 167-169.

Afifi, M.A.; Labib, H.H.; Fouad, S.S.; El-Shazly, A.A., Electrical & Thermal Conductivity of the Amorphous Semiconductor GexSe1-x, Egypt, J. Phys. 17 (1986) 335-342.

Alekperova, Sh.M.; Gadzhieva, G.S., Current-voltage Characteristics of Ag2Se Single Crystal Near the Phase Transition, Inorganic Materials 23 (1987) 137-139.

Aleksiejunas, A.; Cesnys, A., Switching Phenomenon and Memory Effect in Thin-film Heterojunction of Polycrystalline Selenium-silver Selenide, Phys. Stat. Sol. (a) 19 (1973) K169-K171.

Angell, C.A., Mobile Ions in Amorphous Solids, Annu. Rev. Phys. Chem. 43 (1992) 693-717.

Aniya, M., Average Electronegativity, Medium-range-order, and Ionic Conductivity in Superionic Glasses, Solid State Ionics 136-137 (2000) 1085-1089.

Asahara, Y.; Izumitani, T., Voltage Controlled Switching in Cu-As-Se Compositions, J. Non-Cryst. Solids 11 (1972) 97-104.

Asokan, S.; Prasad, M.V.N.; Parthasarathy, G.; Gopal, E.S.R., Mechanical and Chemical Thresholds in IV-VI Chalcogenide Glasses, Phys. Rev. Lett. 62 (1989) 808-810.

Axon Technologies Corporation, Technology Description: *Programmable Metalization Cell (PMC)*, pp. 1-6 (pre-May 2000).

Baranovskii, S.D.; Cordes, H., On the Conduction Mechanism in Ionic Glasses, J. Chem. Phys. 111 (1999) 7546-7557.

Belin, R.; Taillades, G.; Pradel, A.; Ribes, M., Ion Dynamics in Superionic Chalcogenide Glasses: CompleteConductivity Spectra, Solid State Ionics 136-137 (2000) 1025-1029.

Belin, R.; Zerouale, A.; Pradel, A.; Ribes, M., Ion Dynamics in the Argyrodite Compound Ag7GaSe5I: Non-Arrhenius Behavior and Complete Conductivity Spectra, Solid State Ionics 143 (2001) 445-455.

Benmore, C.J.; Salmon, P.S., Structure of Fast Ion Conducting and Semiconducting Glassy Chalcogenide Alloys, Phys. Rev. Lett. 73 (1994) 264-267.

Bernede, J.C., Influence Du Metal Des Electrodes Sur Les Caracteristiques Courant-tension Des Structures M-Ag2Se-M, Thin Solid Films 70 (1980) L1-L4.

Bernede, J.C., Polarized Memory Switching in MIS Thin Films, Thin Solid Films 81 (1981) 155-160.

Bernede, J.C., Switching and Silver Movements in Ag2Se Thin Films, Phys. Stat. Sol. (a) 57 (1980) K101-K104.

Bernede, J.C.; Abachi, T., Differential Negative Resistance in Metal/insulator/metal Structures with an Upper Bilayer Electrode, Thin Solid Films 131 (1985) L61-L64.

Bernede, J.C.; Conan, A.; Fousenan't, E.; El Bouchairi, B.; Goureaux, G., Polarized Memory Switching Effects in Ag2Se/Se/M Thin Film Sandwiches, Thin Solid Films 97 (1982) 165-171.

Bernede, J.C.; Khelil, A.; Kettaf, M.; Conan, A., Transition from S- to N-type Differential Negative Resistance in Al-Al2O3-Ag2-xSe1+x Thin Film Structures, Phys. Stat. Sol. (a) 74 (1982) 217-224.

Bondarev, V.N.; Pikhitsa, P.V., A Dendrite Model of Current Instability in RbAg4I5, Solid State Ionics 70/71 (1994) 72-76.

Boolchand, P., The Maximum in Glass Transition Temperature (Tg) Near x=1/3 in GexSe1-x Glasses, Asian Journal of Physics (2000) 9, 709-72.

Boolchand, P.; Bresser, W.J., Mobile Silver Ions and Glass Formation in Solid Electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of Rigidity in Steps in Chalcogenide Glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural Ordering of Evaporated Amorphous Chalcogenide Alloy Ffilms: Role of Thermal Annealing, Diffusion and Defect Data vol. 53-54 (1987) 415-420.

Boolchand, P.; Grothaus, J.; Bresser, W.J.; Suranyi, P., Structural Origin of Broken Chemical Order in a GeSe2 glass, Phys. Rev. B 25 (1982) 2975-2978.

Boolchand, P.; Grothaus, J.; Phillips, J.C., Broken Chemical Order and Phase Separation in GexSe1-x Glasses, Solid State Comm. 45 (1983) 183-185.

Boolchand, P., Bresser, W.J., Compositional Trends in Glass Transition Temperature (Tg), Network Connectivity and Nanoscale Chemical Phase Separation in Chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 Glasses Compared, Proc. Int. Conf. Phys. Semicond. (Eds. Chadi and Harrison) 17$^{th}$ (1985) 833-36.

Bresser, W.; Boolchand, P.; Suranyi, P., Rigidity Percolation and Molecular Clustering in Network Glasses, Phys. Rev. Lett. 56 (1986) 2493-2496.

Bresser, W.J.; Boolchand, P.; Suranyi, P.; de Neufville, J.P, Intrinsically Broken Chalcogen Chemical Order in Stoichiometric Glasses, Journal de Physique 42 (1981) CA-193-C4-196.

Bresser, W.J.; Boolchand, P.; Suranyi, P.; Hernandez, J.G., Molecular Phase Separation and Cluster Size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-temperature, Electric Field Induced Creation of Stable Devices in CuInSe2 Crystals, Science 258 (1992) 271-274.

Chatterjee, R.; Asokan, S.; Titus, S.S.K., Current-controlled Negative-resistance Behavior and Memory Switching in Bulk As-Te-Se Glasses, J. Phys. D: Appl. Phys. 27 (1994) 2624-2627.

Chen, C.H.; Tai, K.L. , Whisker Growth Induced by Ag Photodoping in Glassy GexSe1-x Films, Appl. Phys. Lett. 37 (1980) 1075-1077.

Chen, G.; Cheng, J., Role of Nitrogen in the Crystallization of Silicon Nitride-doped Chalcogenide Glasses, J. Am. Ceram. Soc. 82 (1999) 2934-2936.

Chen, G.; Cheng, J.; Chen, W., Effect of Si3N4 on Chemical Durability of Chalcogenide Glass, J. Non-Cryst. Solids 220 (1997) 249-253.

Cohen, M.H.; Neale, R.G.; Paskin, A., A Model for an Amorphous Semiconductor Memory Device, J. Non-Cryst. Solids 8-10 (1972) 885-891.

Croitoru, N.; Lazarescu, M.; Popescu, C.; Telnic, M.; and Vescan, L., Ohmic and Non-ohmic Conduction in Some Amorphous Semiconductors, J. Non-Cryst. Solids 8-10 (1972) 781-786.

Dalven, R.; Gill, R., Electrical Properties of Beta-Ag2Te and Beta-Ag2Se From 4.2° to 300° K., J. Appl. Phys. 38 (1967) 753-756.

Davis, E.A., Semiconductors Without Form, Search 1 (1970) 152-155.

Deamaley, G.; Stoneham, A.M.; Morgan, D.V., Electrical Phenomena in Amorphous Oxide Films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold Switching in Hydrogenated Amorphous Silicon, Appl. Phys. Lett. 40 (1982) 812-813.

Drusedau, T.P.; Panckow, A.N.; Klabunde, F., The Hydrogenated Amorphous Silicon/nanodisperse Metal (SIMAL) System-Films of Unique Electronic Properties, J. Non-Cryst. Solids 198-200 (1996) 829-832.

El Bouchairi, B.; Bernede, J.C.; Burgaud, P., Properties of Ag2-xSe1+x/n-Si Diodes, Thin Solid Films 110 (1983) 107-113.

El Gharras, Z.; Bourahla, A.; Vautier, C., Role of Photoinduced Defects in Amorphous GexSe1-x Photoconductivity, J. Non-Cryst. Solids 155 (1993) 171-179.

El Ghrandi, R.; Calas, J.; Galibert, G.; Averous, M., Silver Photodissolution in Amorphous Chalcogenide Tthin Films, Thin Solid Films 218 (1992) 259-273.

El Ghrandi, R.; Calas, J.; Galibert, G., Ag Dissolution Kinetics in Amorphous GeSe5.5 Thin Films from "In-situ" Resistance Measurements vs. Time, Phys. Stat. Sol. (a) 123 (1991) 451-460.

El-kady, Y.L., The Threshold Switching in Semiconducting Glass Ge21Se17Te62, Indian J. Phys. 70A (1996) 507-516.

Elliott, S.R., A Unified Mechanism for Metal Photodissolution in Amorphous Chalcogenide Materials, J. Non-Cryst. Solids 130 (1991) 85-97.

Elliott, S.R., Photodissolution of Metals in Chalcogenide Glasses: A Unified Mechanism, J. Non-Cryst. Solids 137-138 (1991) 1031-1034.

Elsamanoudy, M.M.; Hegab, N.A.; Fadel, M., Conduction Mechanism in the Pre-switching State of Thin Films Containing Te As Ge Si, Vacuum 46 (1995) 701-707.

El-Zahed, H.; El-Korashy, A., Influence of Composition on the Electrical and Optical Properties of Ge20BixSe80-x Films, Thin SOLID fILMS 376 (2000) 236-240.

Fadel, M., Switching Phenomenon in Evaporated Se-Ge-As Thin Films of Amorphous Chalcogenide Glass, Vacuum 44 (1993) 851-855.

Fadel, M.; El-Shair, H.T., Electrical, Thermal and Optical Properties of Se75Ge7Sb18, Vacuum 43 (1992) 253-257.

Feng, X. Bresser, W.J.; Boolchand, P., Direct Evidence for Stiffness Threshold in Chalcogenide Glasses, Phys. Rev. Lett. 78 (1997) 4422-4425.

Feng, X. Bresser, W.J.; Zhang, M.; Goodman, B.; Boolchand, P., Role of Network Connectivity on the Elastic, Plastic and Thermal Behavior of Covalent Glasses, J. Non-Crysta. Solids 222 (1997) 137-143.

Fischer-Colbrie, A.; Bienenstock, A.; Fuoss, P.H.; Marcus, M.A., Structure and Bonding in Photodiffused Amorphous Ag-GeSe2 Thin Films, Phys. Rev. B 38 (1988) 12388-12403.

Fleury, G.; Hamou, A.; Viger, C.; Vautier, C., Conductivity and Crystallization of Amorphous Selenium, Phys. Stat. Sol. (a) 64 (1981) 311-316.

Fritzsche, H, Optical and Electrical Energy Gaps in Amorphous Semiconductors, J. Non-Cryst. Solids 6 (1971) 49-71.

Fritzsche, H., Electronic Phenomena in Amorphous Semiconductors, Annual Review of Materials Science 2 (1972) 697-744.

Gates, B.; Wu, Y.; Yin, Y.; Yang, P.; Xia, Y., Single-crystalline nanowires of Ag2Se can be Synthesized by Templating Against Nanowires of Ttrigonal Se, J. Am. Chem. Soc. (2001) currently ASAP.

Gosain, D.P.; Nakamura, M.; Shimizu, T.; Suzuki, M.; Okano, S., Nonvolatile Memory Based on Reversible Phase Transition Phenomena in Telluride Glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation Creep of Ge-Se Chalcogenide Glasses Below Tg: Elastic Recovery and Non-Newtonian Flow, J. Non-Cryst. Solids 298 (2002) 260-269.

Guin, J.-P.; Rouxel, T.; Sangleboeuf, J.-C; Melscoet, I.; Lucas, J., Hardness, Toughness, and Scratchability of Germanium-selenium Chalcogenide Glasses, J. Am. Ceram. Soc. 85 (2002) 1545-52.

Gupta, Y.P., On Electrical Switching and Memory Effects in Amorphous Chalcogenides, J. Non-Cryst. Sol. 3 (1970) 148-154.

Haberland, D.R.; Stiegler, H., New Experiments on the Charge-controlled Switching Effect in Amorphous Semiconductors, J. Non-Cryst. Solids 8-10 (1972) 408-414.

Haifz, M.M.; Ibrahim, M.M.; Dongol, M.; Hammad, F.H., Effect of Composition on the Structure and Electrical Properties of As-Se-Cu Glasses, J. Apply. Phys. 54 (1983) 1950-1954.

Hajto, J.; Rose, M.J.; Osborne, I.S.; Snell, A.J.; Le Comber, P.G.; Owen, A.E., Quantization Effects in Metal/a-Sl:H/metal Devices, Int. J. Electronics 73 (1992) 911-913.

Hajto, J.; Hu, J.; Snell, A.J.; Turvey, K.; Rose, M., DC and AC Measurements on Metal/a-Si:H/metal Room Temperature Quantised Resistance Devices, J. Non-Cryst. Solids 266-269 (2000) 1058-1061.

Hajto, J.; McAuley, B.; Snell, A.J.; Owen, A.E., Theory of Room Temperature Quantized Resistance Effects in Metal-a-Si:H-metal Thin Film Structures, J. Non-Cryst. Solids 198-200 (1996) 825-828.

Hajto, J.; Owen, A.E.; Snell, A.J.; Le Comber, P.G.; Rose, M.J., Analogue Memory and Ballistic Electron Effects in Metal-amorphous Silicon Structures, Phil. Mag. B 63 (1991) 349-369.

Hayashi, T.; Ono, Y.; Fukaya, M.; Kan, H., Polarized Memory Switching in Amorphous Se Film, Japan. J. Appl. Phys. 13 (1974) 1163-1164.

Hegab, N.A.; Fadel, M.; Sedeek, K., Memory Switching Phenomena in Thin Films of Chalcogenide Semiconductors, Vacuum 45 (1994) 459-462.

Helbert et al., *Intralevel Hybrid Resist Process with Submicron Capability*, SPIE vol. 333 Submicron Lithography, pp. 24-29 (1982).

Hilt, Dissertation: *Materials Characterization of Silver Chalcogenide Programmable Metalization Cells*, Arizona State University, pp. Title p.-114 (UMI Company, May 1999).

Hirose et al., *High Speed Memory Behavior and Reliability of an Amorphous $As_2S_3$ Film Doped with Ag*, Phys. Stat. Sol. (a) 61, pp. 87-90 (1980).

Hirose, Y.; Hirose, H., Polarity-dependent Memory Switching and Behavior of Ag Dendrite in Ag-photodoped Amorphous As2S3 Films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching Behavior in II-IV-V2 Amorphous Semiconductor Systems, J. Non-Cryst. Solids 116 (1990) 191-200.

Hosokawa, S., Atomic and Electronic Structures of Glassy GexSe1-x Around the Stiffness Threshold Composition, J. Optoelectronics and Advanced Materials 3 (2001) 199-214.

Hu, J.; Snell, A.J.; Hajto, J.; Owen, A.E., Constant Current Forming in Cr/p+a-Si:H/V Thin Film Devices, J. Non-Cryst. Solids 227-230 (1998) 1187-1191.

Hu, J.; Hajto, J.; Snell, A.J.; Owen, A.E.; Rose, M.J., Capacitance Anomaly Near the Metal-Non-metal Transition in Cr-hydrogenated Amorphous Si-V Thin-film Devices, Phil. Mag. B. 74 (1996) 37-50.

Hu, J.; Snell, A.J.; Hajto, J.; Owen, A.E., Current-induced Instability in Cr-p+a-Si:H-V Thin Film Devices, Phil. Mag. B 80 (2000) 29-43.

Huggett et al., Development of Silver Sensitized Germanium Selenide Photoresist by Reactive Sputter Etching in SF6, 42 Appl. Phys. Lett., No. 7, pp. 592-594 (Apr. 1983).

Iizima, S.; Sugi, M.; Kikuchi, M.; Tanaka, K., Electrical and Thermal Properties of Semiconducting Glasses As-Te-Ge, Solid State Comm. 8 (1970) 153-155.

Ishikawa, R.; Kikuchi, M., Photovoltaic Study on the Photo-enhanced Diffusion of Ag in Amorphous Films of Ge2S3, J. Non-Cryst. Solids 35 & 36 (1980) 1061-1066.

Iyetomi, H.; Vashishta, P.; Kalia, R.K., Incipient Phase Separation in Ag/Ge/Se Glasses: Clustering of Ag Atoms, J. Non-Cryst. Solids 262 (2000) 135-142.

Jones, G.; Collins, R.A., Switching Properties of Thin Selenium Films Under Pulsed Bias, Thin Solid Films 40 (1977) L15-L18.

Joullie, A.M.; Marucchi, J., On the DC Electrical Conduction of Amorphous As2Se7 Before Switching, Phys. Stat. Sol. (a) 13 (1972) K105-K109.

Joullie, A.M.; Marucchi, J., Electrical Properties of the Amorphous Alloy As2Se5, Mat. Res. Bull. 8 (1973) 433-441.

Kaplan, T.; Adler, D., Electrothermal Switching in Amorphous Semiconductors, J. Non-Cryst. Solids 8-10 (1972) 538-543.

Kawaguchi et al., *Mechanism of Photosurface Deposition*, 164-166 J. Non-Cryst. Solids, pp. 1231-1234 (1993).

Kawaguchi, T.; Maruno, S.; Elliott, S.R., Optical, Electrical, and Structural Properties of Amorphous Ag-Ge-S and Ag-Ge-Se Films and Comparison of Photoinduced and Thermally Induced Phenomena of Both Systems, J. Appl. Phys. 79 (1996) 9096-9104.

Kawaguchi, T.; Masui, K., Analysis of Change in Optical Ttransmission Spectra Resulting from Ag Photodoping in Chalcogenide Film, Japn. J. Appl. Phys. 26 (1987) 15-21.

Kawamoto, Y., Nishida, M., Ionic Condition in As2S3—Ag2S, GeS2—GeS—Ag2S and P2S5-Ag2S Glasses, J. Non-Cryst Solids 20 (1976) 393-404.

Kawasaki, M.; Kawamura, J.; Nakamura, Y.; Aniya, M., Ionic Conductivity of Agx(GeSe3)1-x (0<=x<=0.571) Glasses, Solid State Ionics 123 (1999) 259-269.

Kluge, G.; Thomas, A.; Klabes, R.; Grotzschel, R., Suptitz, P. Silver Photodiffusion in Amorphous GexSe100-x, J. Non-Cryst. Solids 124 (1990) 186-193.

Kolobov, A.V., On the Origin of P-type Conductivity in Amorphous Chalcogenides, J. Non-Cryst. Solids 198-200 (1996) 728-731.

Kolobov, A.V., Lateral Diffusion of Silver in Vitreous Chalcogenide Films, J. Non-Cryst. Solids 137-138 (1991) 1027-1030.

Kolobov et al., Photodoping of Amorphous Chalcogenides by Metals, Advances in Physics, 1991, vol. 40, No. 5, pp. 625-684.

Korkinova, Ts.N.; Andreichin, R.E., Chalcogenide Glass Polarization and the Type of Contacts, J. Non-Cryst. Solids 194 (1996) 256-259.

Kotkata, M.F.; Afifi M.A.; Labib, H.H.; Hegab, N.A.; Abdel-Aziz, M.M., Memory Switching in Amorphous GeSeTl Chalcogenide Semiconductor Films, Thin Solid Films 240 (1994) 143-146.

Kozicki et al., Silver Incorporation in Thin Films of Selenium Rich Ge-Se Glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal-doped Chalcogenides, Electrochemical Society Proceedings, vol. 99-13, 1999, pp. 298-309.

Kozicki et al., Nanoscale Effects in Devices Based on Chalcogenide Solid Solutions, Superlattices and Microstructures, vol. 27, No. 5/6, 2000, pp. 485-488.

Kozicki et al., Nanoscale Phase Separation in Ag-Ge-Se Glasses, Microelectronic Engineering 63 (2002) pp. 155-159.

Lakshminarayan, K.N.; Srivastava, K.K.; Panwar, O.S.; Kumar, A., Amorphous Semiconductor Devices: Memory and Switching Mechanism, J. Instn Electronics & Telecom. Engrs 27 (1981) 16-19.

Lai, M.; Goyal, N., Chemical Bond Approach to Study the Memory and Threshold Switching Chalcogenide Glasses, Indian Journal of Pure & Appl. Phys. 29 (1991) 303-304.

Leimer, F.; Stotzel, H.; Kottwitz, A., Isothermal Electrical Polarisation of Amorphous GeSe Films with Blocking Al Contacts Influenced by Poole-Frenkel Conduction, Phys. Stat. Sol. (a) 29 (1975) K129-K132.

Leung, W.; Cheung, N.; Neureuther, A.R., Photoinduced Diffusion of Ag in GexSe1-x Glass, Appl. Phys. Lett. 46 (1985) 543-545.

Matsushita, T.; Yamagami, T.; Okuda, M., Polarized Memory Effect Observed on Se-SnO2 System, Jap. J. Appl. Phys. 11 (1972) 1657-1662.

Matsushita, T.; Yamagami, T.; Okuda, M., Polarized Memory Effect Observed on Amorphous Selenium Thin Films, Jpn. J. Appl. Phys. 11 (1972) 606.

Mazurier, F.; Levy, M.; Souquet, J.L, Reversible and Irreversible Electrical Switching in TeO2-V2O5 Based Glasses, Journal de Physique IV 2 (1992) C2-185-C2-188.

McHardy et al., The Dissolution of Metals in Amorphous Chalcogenides and the Effects of Electron and Ultraviolet Radiation, 20 J. Phys. C.: Solid State Phys., pp. 4055-4075 (1987).

Messoussi, R.; Bernede, J.C.; Benhida, S.; Abachi, T.; Latef, A., Electrical Characterization of M/Se Structures (M=Ni,Bi), Mat. Chem. And Phys. 28 (1991) 253-258.

Mitkova, M.; Boolchand, P., Microscopic Origin of the Glass Forming Tendency in Chalcohalides and Constraint Theory, J. Non-Cryst. Solids 240 (1998) 1-21.

Mitkova, M.; Kozicki, M.N., Silver Incorporation in Ge-Se Glasses Used in Programmable Metallization Cell Devices, J. Non-Cryst. Solids 299-302 (2002) 1023-1027.

Mitkova, M.; Wang, Y.; Boolchand, P., Dual Chemical Role of Ag as an Additive in Chalcogenide Glasses, Phys. Rev. Lett. 83 (1999) 3848-3852.

Miyatani, S.-y., Electronic and Ionic Conduction in (AgxCu1-x)2Se, J. Phys. Soc. Japan 34 (1973) 423-432.

Miyatani, S.-y., Electrical Properties of Ag2Se, J. Phys. Soc. Japan 13 (1958) 317.

Miyatani, S.-y., Ionic Conduction in Beta-Ag2Te and Beta-Ag2Se, Journal Phys. Soc. Japan 14 (1959) 996-1002.

Mott, N.F., Conduction in Glasses Containing Transition Metal Ions, J. Non-Cryst. Solids 1 (1968) 1-17.

Nakayama, K.; Kitagawa, T.; Ohmura, M.; Suzuki, M., Nonvolatile Memory Based on Phase Transition in Chalcogenie Thin Films, Jpn. J. Appl. Phys. 32 (1993) 564-569.

Nakayama, K.; Kojima, K.; Hayakawa, F.; Imai, Y.; Kitagawa, A.; Suzuki, M., Submicron Nonvolatile Memory Cell Based on Reversible Phase Transition in Chalcogenide Glasses, Jpn. J. Appl. Phys. 39 (2000) 6157-6161.

Nang, T.T.; Okuda, M.; Matsushita, T.; Yokota, S.; Suzuki, A., Electrical and Optical Properties of GexSe1-x Amorphous Thin Films, Jap. J. App. Phys. 15 (1976) 849-853.

Narayanan, R.A.; Asokan, S.; Kumar, A., Evidence Concerning the Effect of Topology on Electrical Switching in Chalcogenide Network Glasses, Phys. Rev. B 54 (1996) 4413-4415.

Neale, R.G; Aseltine, J.A., The Application of Amorphous Materials to Computer Memories, IEEE Transactions on Electron Dev. Ed-20 (1973) 195-209.

Ovshinsky S.R.; Fritzsche, H., Reversible Structural Transformations in Amorphous Semiconductors for Memory and Logic, Metalurgical Transactions 2 (1971) 641-645.

Ovshinsky, S.R., Reversible Electrical Switching Phenomena in Disordered Structures, Phys. Rev. Lett. 21 (1968) 1450-1453.

Owen, A.E.; LeComber, P.G.; Sarrabayrouse, G.; Spear, W.E., New Amorphous-silicon Electrically Programmable Nonvolatile Switching Device, IEE Proc. 129 (1982) 51-54.

Owen, A.E.; Firth, A.P.; Ewen, P.J.S., Photo-induced Structural and Physico-chemical Changes in Amorphous Chalcogenide Semiconductors, Phil. Mag. B 52 (1985) 347-362.

Owen, A.E.; Le Comber, P.G.; Hajto, J.; Rose, M.J.; Snell, A.J., Switching in Amorphous Devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pearson, A.D.; Miller, C.E., Filamentary Conduction in Semiconducting Glass Diodes, App. Phys. Lett. 14 (1969) 280-282.

Pinto, R.; Ramanathan, K.V., Electric Field Induced Memory Switching in Thin Films of the Chalcogenide System Ge-As-Se, Appl. Phys. Lett. 19 (1971) 221-223.

Popescu, C., The Effect of Local Non-uniformities on Thermal Switching and High Field Behavior of Structures with Chalcogenide Glasses, Solid-State Electronics 18 (1975) 671-681.

Popescu, C.; Croitoru, N., The Contribution of the Lateral Thermal Instability to the Switching Phenomenon, J. Non-Cryst. Solids 8-10 (1972) 531-537.

Popov, A.I.; Geller, I.KH.; Shemetova, V.K., Memory and Threshold Switching Effects in Amorphous Selenium, Phys. Stat. Sol. (a) 44 (1977) K71-K73.

Prakash, S.; Asokan, S.; Ghare, D.B., Easily Reversible Memory Switching in Ge-As-Te Glasses, J. Phys. D: Appl. Phys. 29 (1996) 2004-2008.

Rahman, S.; Sivarama Sastry, G., Electronic Switching in Ge-Bi-Se-Te Glasses, Mat. Sci. and Eng. B12 (1992) 219-222.

Ramesh, K.; Asokan, S.; Sangunni, K.S.: Gopal, E.S.R., Electrical Switching in Germanium Telluride Glasses Doped with Cu and Ag. Appl. Phys. A 69 (1999) 421-425.

Rose,M.J.;Hajto,J.;Lecomber,P.G.;Gage,S.M.;Choi,W.K.;Snell,A.J. ;Owen,A.E., Amorphous Silicon Analogue Memory Devices, J. Non-Cryst. Solids 115 (1989) 168-170.

Rose,M.J.;Snell,A.J.;Lecomber,P.G.;Hajto,J.;Fitzgerald,A.G. ;Owen,A.E., Aspects of Non-volatility in a -Si:H Memory Devices, Mat. Res. Soc. Symp. Proc. V 258, 1992, 1075-1080.

Schuocker, D.; Rieder, G., On the Reliability of Amorphous Chalcogenide Switching Devices, J. Non-Cryst. Solids 29 (1978) 397-407.

Sharma, A.K.; Singh, B., Electrical Conductivity Measurements of Evaporated Selenium Films in Vacuum, Proc. Indian Natn. Sci. Acad. 46, A, (1980) 362-368.

Sharma, R. P., Structural, Electrical and Optical Properties of Silver Selenide Films, Ind. J. Of Pure and Applied Phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3665 (1973).

Snell, A.J.; Lecomber, P.G.; Hajto, J.; Rose, M.J.; Owen, A.E.; Osborne, I.S., Analogue Memory Effects in Metal/a-Si:H/metal Memory Devices, J. Non-Cryst. Solids 137-138 (1991) 1257-1262.

Snell, A.J.; Hajto, J.;Rose, M.J.; Osborne, I.S.; Holmes, A.; Owen, A.E.; Gibson, R.A.G., Analogue Memory Effects in Metal/a-Si:H/metal Thin Film Structures, Mat. Res. Soc. Symp. Proc. V 297, 1993, 1017-1021.

Steventon, A.G., Microfilaments in Amorphous Chalcogenide Memory Devices, J. Phys. D: Appl. Phys. 8 (1975) L120-L122.

Steventon, A.G., The Switching Mechanisms in Amorphous Chalcogenide Memory Devices, J. Non-Cryst. Solids 21 (1976) 319-329.

Stocker, H.J., Bulk and Thin Film Switching and Memory Effects in Semiconducting Chalcogenide Glasses, App. Phys. Lett. 15 (1969) 55-57.

Tanaka, K., Ionic and Mixed Conductions in Ag Photodoping Process, Mod. Phys. Lett B 4 (1990) 1373-1377.

Tanaka, K.; Iizima, S.; Sugi, M.; Okada, Y.; Kikuchi, M., Thermal Effect on Switching Phenomenon in Chalcogenide Amorphous Semiconductors, Solid State Comm. 8 (1970) 387-389.

Thornburg, D.D., Memory Switching in a Type I Amorphous Chalcogenide, J. Elect. Mat. 2, (1973) 3-15.

Thornburg, D.D., Memory Switching in Amorphous Arsenic Triselenide, J. Non-Cryst. Solids 11 (1972) 113-120.

Thornburg, D.D.; White, R.M., Electric Field Enhanced Phase Separation and Memory Switching in Amorphous Arsenic Triselenide, Journal (1972) 4609-4612.

Tichy, L.; Ticha, H., Remark on the Glass-forming Ability in GexSe1-x and AsxSe1-x Systems, J. Non-Cryst. Solids 261 (2000) 277-281.

Titus, S.S.K.; Chatterjee, R.; Asokan, S., Electrical Switching and Short-range Order in As-Te Glasses, Phys. Rev. B 48 (1993) 14650-14652.

Tranchant,S.;Peytavin,S.;Ribes,M.;Flank,A.M.;Dexpert,H. ;Lagarde,J.P., Silver Chalcogenide Glasses Ag-Ge-Se: Ionic Conduction and Exafs Structural Investigation, Transport-structure Relations in Fast Ion and Mixed Conductors Proceedings of the 6th Riso International Symposium. Sep. 9-13, 1985, pp. 425-430.

Tregouet, Y.; Bernede, J.C., Silver Movements in Ag2Te Thin Films: Switching and Memory effects, Thin Solid Films 57 (1979) 49-54.

Uemura, O.; Kameda, Y.; Kokai, S.; Satow, T., Thermally Induced Crystallization of Amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric Field Induced Filament Formation in As-Te-Ge Glass, J. Non-Cryst. Solids 2 (1970) 358-370.

Viger, C.; Lefrancois, G.; Fleury, G., Anomalous Behaviour of Amorphous Selenium Films, J. Non-Cryst. Solids 33 (1996) 267-272.

Vodenicharov, C.; Parvanov,S.; Pelkov,P., Electrode-limited Currents in the Thin-film M-GeSe-M System, Mat. Chem. And Phys. 21 (1989) 447-454.

Wang, S.-J.; Misium, G.R.; Camp, J.C.; Chen, K.-L.; Tigelaar, H.L., High-performance Metal/silicide Antifuse, IEEE Electron Dev. Lett. 13 (1992) 471-472.

Weirauch, D.F., Threshold Switching and Thermal Filaments in Amorphous Semiconductors, App. Phys. Lett. 16 (1970) 72-73.

West, W.C.; Sieradzki, K.; Kardynal, B.; Kozicki, M.N., Equivalent Circuit Modeling of the Ag|As0.24S0.36Ag0.40|Ag System Prepared by Photodissolution of Ag, J. Electrochem. Soc. 145 (1998) 2971-2974.

West, W.C., Electrically Erasable Non-volatile Memory Via Electrochemical Deposition of Multifractal Aggregates, Ph.D. Dissertation, ASU 1998, 189 pages.

Zhang, M.; Mancini, S.; Bresser, W.; Boolchand, P., Variation of Glass Transition Temperature, Tg, with Average Coordination Number, <m>, in Network Glasses: Evidence of a Threshold Behavior in the Slope |dTg/d<m>| at the Rigidity Percolation Threshold (<m>=2. 4), J. Non-Cryst. Solids 151 (1992) 149-154.

Pattanayak, P.; Asokan, S., Signature of a Silver Phase Percolation Threshold in Microscopically Phase Separated Ternary $Ge_{0.15}Se_{0.85-x}Ag_x$ ($0 \leq k \geq 20$) Glasses, J. App. Phys. 97 (published online Dec. 13, 2004).

* cited by examiner

PROCESS FOR ERASING CHALCOGENIDE VARIABLE RESISTANCE MEMORY BITS

FIELD OF THE INVENTION

The invention relates generally to the field of semiconductor devices and, more particularly, to variable resistance memory devices.

BACKGROUND OF THE INVENTION

Microprocessor-accessible memory devices have traditionally been classified as either non-volatile or volatile memory devices. Non-volatile memory devices are capable of retaining stored information even when power to the memory device is turned off. However, non-volatile memory devices occupy a large amount of space and consume large quantities of power, making these devices unsuitable for use in portable devices or as substitutes for frequently-accessed volatile memory devices. On the other hand, volatile memory devices tend to provide greater storage capability and programming options than non-volatile memory devices. Volatile memory devices also generally consume less power than non-volatile devices. However, volatile memory devices require a continuous power supply in order to retain stored memory content.

Commercially viable memory devices that are both randomly accessed and semi-volatile or non-volatile are desired. Various implementations of such semi-volatile and nonvolatile random access memory devices are being developed. These devices store data in a plurality of memory cells by structurally or chemically changing the resistance across the memory cells in response to predetermined voltages applied to the memory cells. Examples of variable resistance memory devices being investigated include memories using variable resistance polymers, perovskite, doped amorphous silicon, phase-changing glasses, or doped chalcogenide glass, among others.

In a variable resistance memory cell, a first value may be written to the variable resistance memory cell by applying a voltage having a predetermined level. The applied voltage changes the electrical resistance across the memory cell. A second value, or the default value, may be written or restored in the memory cell by applying a second voltage to the memory cell, thereby changing the resistance across the memory cell to the original resistance level. The second voltage is typically a negative voltage in comparison to the first voltage and may or may not have the same magnitude as the first voltage. Each resistance state is stable, so that the memory cells are capable of retaining their stored values without being frequently refreshed. The variable resistance materials can thus be "programmed" to any of the stable resistance values.

The content of a variable resistance memory cell is read or "accessed" by applying a read voltage to determine the resistance level across the cell. The magnitude of the read voltage is lower than the magnitude of the voltage required to change the resistance of the variable resistance memory cell. In a binary variable resistance memory cell, upon determining the resistance level of the variable resistance memory cell, the detected resistance level is compared with a reference resistance level. Generally, if the detected resistance level is greater than the reference level, the memory cell is determined to be in the "off" state. On the other hand, if the detected resistance level is less than the reference level, the memory cell is determined to be in the "on" state.

FIG. 1 shows a basic composition of a variable resistance memory cell 10 constructed over a substrate 12, having a variable resistance material 16 formed between two electrodes 14, 18. One type of variable resistance material may be amorphous silicon doped with V, Co, Ni, Pd, Fe and Mn as disclosed in U.S. Pat. No. 5,541,869 to Rose et al. Another type of variable resistance material may include perovskite materials such as $Pr_{(1-x)}Ca_xMnO_3$ (PCMO), $La_{(1-x)}Ca_xMnO_3$ (LCMO), $LaSrMnO_3$ (LSMO), $GdBaCo_xO_y$ (GBCO) as disclosed in U.S. Pat. No. 6,473,332 to Ignatiev et al. Still another type of variable resistance material may be a doped chalcogenide glass of the formula $A_xB_y$, where "B" is selected from among S, Se and Te and mixtures thereof, and where "A" includes at least one element from Group IIIA (B, Al, Ga, In, Tl), Group IVA (C, Si, Ge, Sn, Pb), Group VA (N, P, As, Sb, Bi), or Group VIIA (F, Cl, Br, I, At) of the periodic table, and with the dopant being selected from among the noble metals and transition metals, including Ag, Au, Pt, Cu, Cd, Ir, Ru, Co, Cr, Mn or Ni, as disclosed in U.S. Published Application Nos. 2003/0045054 and 2003/0047765 to Campbell et al. and Campbell, respectively. Yet another type of variable resistance material includes a carbon-polymer film comprising carbon black particulates or graphite, for example, mixed into a plastic polymer, such as that disclosed in U.S. Pat. No. 6,072,716 to Jacobson et al. The material used to form the electrodes 14, 18 can be selected from a variety of conductive materials, such as tungsten, nickel, tantalum, titanium, titanium nitride, aluminum, platinum, or silver, among others.

In FIG. 2, a typical prior art variable resistance memory cell 100 is shown to include an access device 102, a variable resistance memory element 104, and a cell plate 110. The access device 102 is a transistor having a gate 102a coupled to a word line 106 and one terminal (source) 102b coupled to a bit line 108. The other terminal (drain) 102c of the access device 102 is coupled to one end of the variable resistance memory element 104, while the other end of the variable resistance memory element 104 is coupled to the cell plate 110. The cell plate 110 may span and be coupled to several other variable resistance memory cells, and may form the anode of all the memory elements 104 in an array of variable resistance memory cells. The cell plate 110 is also coupled to a potential source 112.

A representative diagram of the physical structure of the prior art memory cell 100 is shown in FIG. 3. In particular, a p-doped substrate 126 includes two n-wells 120, 122. Access device 102 is formed on the surface of the substrate 126 between the two n-wells 120, 122, so that the two n-wells 120, 122 serve as the source 102b and drain 102c, respectively, of the access device 102. Word line 106 is formed as a conductive strip extending into the page across the top of access device 102. Bit line 108 is connected directly to the n-well 120 forming the source 102b of the access device 102. Variable resistance memory element 104 is formed on the substrate with its cathode 114 in contact with n-well 122 and the cell plate 110 (only a portion of which is shown) as its anode. The cell plate 110 of memory element 104 is connected to a potential source 112.

In the conventional operating scheme for the cell 100, when the memory element 104 is idle, the voltage across the anode 110 and the cathode 114 is below a threshold voltage $V_G$. The value of the threshold voltage $V_G$ is a function of the specific variable resistance material used in the memory element 104. In order to perform any access operations including programming the variable resistance memory ele ment 104 to the low resistance state, erasing a programmed variable resistance memory element 104 by returning the variable resistance memory element 104 to the high resistance state, or reading the value stored in memory element 104, the threshold voltage $V_G$ must be applied to the word line 106. The voltage $V_G$ on the word line 106 activates the gate 102a of the access device 102 so that an n-channel is formed in the substrate 126 under the gate structure of the access device 102 and across the gap between the two n-wells 120, 122 thus activating the access device 102. Upon activating the access device 102, the memory element 104 can be programmed to the low resistance state by applying a write (positive) voltage having at least the magnitude of a threshold voltage $V_{TW}$ across the memory element 104.

In conventional operating schemes, application of the write voltage may be achieved by raising the potential at the cell plate 110 (anode) relative to the access device drain 102b by applying or raising the voltage at the potential source 112, lowering the potential of the bit line 108, or a combination of both. To erase a programmed memory element 104, a negative voltage having a magnitude of at least a threshold erase voltage is applied between the anode and the cathode of the memory element 104, such that the potential at the cell plate 110 is lower than the potential of the bit line 108.

Variable resistance memory cells are arranged as an array of memory cells and are written, erased, and read using a controller. FIG. 4 illustrates a prior art memory device 200 comprising an array of memory cells 100a–100f arranged in rows and columns. The memory cells 100a–100f along any given bit line 108a, 108b do not share a common word line 106a–106c. Conversely, the memory cells 100a–100f along any given word line 106a–106c do not share a common bit line 108a–108b. In this manner, each memory cell is uniquely identified by the combined selection of the word line to which the gate of the memory cell access device is connected, and the bit line to which the source of the memory cell access device is connected.

Each word line 106a–106c is connected to a word line driver 202a–202c via a respective transistor 204a–204c for selecting the respective word line for an access operation. The gates of the transistors 204a–204c are used to selectively couple or decouple the word lines 106a–106c to or from the word line drivers 202a–202c. Similarly, each bit line 108a, 108b is coupled to a driver 206a, 206b via selector gates 208a, 208b. The current and/or resistance of a selected memory cell 100a–100f is measured by sensor amplifiers 210a, 210b connected respectively to the bit lines 108a, 108b.

For simplicity, FIG. 4 illustrates a memory array having only two rows of memory cells 100 on two bit lines 108a–108b and three columns of memory cells 100 on three word lines 106a–106c. However, it should be understood that in practical applications, memory devices would have significantly more cells in an array. For example, an actual memory device may include several million memory cells 100 arranged in a number of subarrays.

While the overall operating scheme of the memory device 200 may be similar regardless of the type of variable resistance material used in the memory elements, much research has focused on memory devices using memory elements having doped chalcogenide materials as the variable resistance material. More specifically, memory cells having a variable resistance material formed of germanium-selenide glass having a stoichiometry of $Ge_xSe_{(100-x)}$, with x ranging from about 20 to about 43, which are doped with metal ions, have been shown to be particularly promising for providing a viable commercial alternative to traditional random-access memory devices.

Generally, a metal ion doped chalcogenide variable resistance memory cell having such stoichiometry has an initial "off" state resistance of over 100 k (for example, 1 M). To perform a write operation on a chalcogenide memory cell in its normal high resistive state, a voltage having at least a threshold potential is applied to the electrode serving as the anode, with the cathode held at the reference potential or ground. Upon applying the threshold level or write voltage, the resistance across the memory cell changes to a level dramatically reduced from the resistance in its normal state. The new resistance of the memory cell is less than 100 k (for example, 20 k). The cell is considered to be in the "on" state while in the low-resistive state.

The variable resistance memory cell retains this new lower level of resistivity until the resistivity is changed by another qualifying voltage level applied to one of the electrodes of the cell. For example, the memory cell is returned to the high resistance state by applying an erase voltage thereto in the negative direction of the voltage applied in the write operation (to achieve the lower resistance state). The erase voltage may or may not be the same magnitude as the write voltage, but is at least of the same order of magnitude.

Such chalcogenide variable resistance memory cells can retain a low-resistance state for several hours, days, or even weeks and are relatively non-volatile compared with typical random-access memory devices. However, while metal ion doped chalcogenide variable resistance memory cells in the high resistance state are completely non-volatile, variable resistance memory cells written to the low resistive state may gradually lose their conductivity across the chalcogenide glass layer and drift towards the high resistive state after an extended period of time. In particular, it has been found that metal ion doped chalcogenide variable resistance memory devices which are written using write voltages with pulse widths of less than 100 ns have a tendency to gradually lose their low resistance characteristic in as little as a week. Accordingly, such variable resistance memory devices may require some intermittent refreshing to maintain optimal operation of the devices.

In addition to intermittent refresh operations, metal ion doped chalcogenide variable resistance memory cells may require an occasional reset operation to reset the bistable resistance levels. Over time, the resistance levels resulting from application of various threshold voltages tend to drift. The drifting voltage/resistance (V/R) relationship is further explained below in the context of write and erase operations via measured voltage/resistance curves.

A standard voltage/resistance curve for a write operation performed on a properly functioning metal ion doped chalcogenide variable resistance memory cell is illustrated in FIG. 6A. A voltage/resistance curve, such as that shown in FIG. 6A, is derived by measuring the resistance across the chalcogenide variable resistance memory cell as a function of voltage for a given current. The initial or normal resistance level of a chalcogenide variable resistance memory cell is shown as $R_{OFF}$, which is above a minimum threshold level $R_{EMin}$ in which the chalcogenide variable resistance memory cell is stable in a high resistance state. When the chalcogenide variable resistance memory cell is in the high resistance state and $V_{TW}$ is applied to the cell, the resistance drops to the level indicated by $R_{ON}$, which is below a maximum threshold level $R_{WMax}$ in which the chalcogenide variable resistance memory cell is stable in a low resistance state.

FIG. 5B shows the same programming circuit 300 illustrated in FIG. 5A, except that an erase voltage $V_{TE}$ is applied to the bottom electrode 114 to illustrate an erase operation. By way of example, $V_{TE}$ has a voltage level of −0.75 V and a pulse width of about 8 ns. Upon the application of $V_{TE}$ to the bottom electrode 114 of the chalcogenide variable resistance memory cell 310, the chalcogenide variable resistance memory cell 310 returns to its high resistance ("off") state, thus erasing the binary value of "1" previously written in the cell, so that the value of "0" is again stored in the chalcogenide variable resistance memory cell 310.

FIG. 6B shows a typical voltage-resistance curve for a metal ion doped chalcogenide variable resistance memory cell during an erase operation. As in FIG. 6A, $R_{ON}$ indicates the resistance level of the memory cell in the low resistance ("on") state, and $R_{WMax}$ represents the maximum resistance value at which the memory cell is stable in the low resistance state, while $R_{OFF}$ indicates a resistance level of the memory cell in the high resistance ("off") state, and $R_{EMin}$ demonstrates the minimum resistance value at which the memory cell is stable in the high resistance state. When the metal ion doped chalcogenide variable resistance memory cell is in the low resistance state and $V_{TE}$ is subsequently applied to the cell, the resistance in the chalcogenide variable resistance memory cell increases to the level indicated by $R_{OFF}$. It is noted that the write voltage $V_{TW}$ is not necessarily of the same magnitude as the erase voltage $V_{TE}$.

However, as mentioned above, the resistance profiles of metal ion doped chalcogenide variable resistance memory cells have a tendency to shift after a number of read or write operations have been applied to the cell. Specifically, the cell may eventually be written into an "on" state in which the resistance in that state is unacceptably high or unacceptably low, or an erase operation may place the cell in an "off" state in which the resistance in that state is unacceptably low or unacceptably high. This can happen in as few as about 400 write and erase cycles. Typical life expectancies for random access memory devices are on the order of $10^{14}$ write/erase cycles. Thus, the resistance drift should be corrected for longevity of operation of the memory cell.

The phenomenon of resistance drift is demonstrated in FIG. 7, which depicts the case when the chalcogenide variable resistance memory cell drifts towards a low resistance "off" state $R_{DE}$, meaning that after repeated cycles over time, the "off" state resistance achieved upon application of the fixed erase voltage $V_{TE}$ falls below the level $R_{OFF}$ shown in FIG. 6B. Similarly, the memory cell exhibits an unusually low resistance "on" state $R_{ON}$. The resistance $R_{ON}$ becomes progressively more variable and drifts increasingly lower upon the performance of repeated erase cycles until application of the threshold erase voltage $V_{TE}$ is consistently insufficient to bring the memory cell to the minimum stable high resistance level $R_{EMin}$, as illustrated in FIG. 6. Once this condition is reached, subsequent erase operations will fail to erase the stored value in the chalcogenide variable resistance memory cell, causing a breakdown in the function of the chalcogenide variable resistance memory device. Additionally, continued write cycles applied to these already low resistance state memory cells result in pushing the memory cells into an even lower resistance state.

A solution to the voltage/resistance curve shift problem described above and illustrated in FIG. 7 is to periodically reset the memory cells to an original high resistance level.

An applied reset or "hard" erase pulse serves to reestablish the original resistance profile of the memory cell in the high resistance state. The "hard" erase pulse may be applied by increasing the voltage level and/or the pulse width relative to erase voltage $V_{TE}$ applied in a normal erase operation. A "normal" erase pulse is illustrated in FIG. 8A having, for example, a voltage level of −0.8 V and a duration of 8 ns. A first type of "hard" erase pulse is shown in FIG. 8B, in which the applied pulse is the same duration as the normal erase pulse, but has a negative voltage level of a magnitude greater than the −0.8 V of the normal erase pulse. An alternative "hard" erase pulse is shown in FIG. 8C, in which the "hard" erase pulse has the same magnitude as the normal erase pulse, but has a longer pulse width. In a further alternative, the "hard" erase pulse may have both a greater magnitude and a longer duration than the normal erase pulse. The amount by which the voltage level or the duration of the "hard" erase pulse exceeds that of the normal erase pulse may vary depending on the amount of drift, or the amount by which $R_{DE}$ falls below $R_{EMin}$.

A significant challenge exists in determining an appropriate magnitude of an applied "hard" erase voltage pulse, as illustrated in FIGS. 9A, 9B and 9C. A proposed metal ion doped chalcogenide variable resistance memory cell 500 is depicted in FIG. 9B, comprising a p-doped substrate 526 and two n-wells 520, 522. An access device 502 is depicted as a transistor, and is shown in both FIGS. 9A and 9B. The access device 502 is activated by an "on" word line 506 (i.e., a word line having a voltage sufficient to activate access device 502), which is connected to the gate of the transistor. The active access device 502 allows current to flow between the bit line 508 (connected to the source of the transistor) and the cell plate 510 (connected through the variable resistance memory element 504 to the drain of the transistor). In other words, when the access device 502 is activated, current must flow through two series resistances (refer to FIG. 9C). One resistance, the cell resistance, $R_{cell}$, is highly variable, due to the drifting $R_{ON}$ and $R_{DE}$ levels, as described in detail above. Typically, $R_{cell}$ can range anywhere from 5 k● to 46 k●. The other resistance that must be accounted for is the channel resistance, $R_{channel}$, which is generally about 30 k●. With both resistances $R_{cell}$, $R_{channel}$ in series, a voltage divider equation must be solved in order to determine the voltage across the chalcogenide variable resistance memory cell 504.

$$V_{cell} = \frac{(V_{BL} - V_{cpin}) * R_{cell}}{R_{cell} + R_{channel}} \qquad \text{Eq. 1}$$

Using Equation 1, and setting (for purposes of example only) $V_{BL}$ to equal 2.2 V and $V_{cpin}$ to equal 0.6 V, the value of $V_{cell}$ will range from 0.23 V to 0.97 V as a result of the variable resistance of $R_{cell}$. In other words, if the resistance-voltage curve for the chalcogenide variable resistance memory cell has drifted too low, as shown in FIG. 7, then a normal "hard" erase voltage applied to $V_{BL}$ and $V_{cpin}$ may not create a sufficient differential to actually reset the chalcogenide variable resistance memory cell.

From the discussion above, it should be appreciated that an improved method for effectuating a "hard" erase of a chalcogenide variable resistance memory cell is both needed and desired.

BRIEF SUMMARY OF THE INVENTION

In one embodiment of the invention, a method of erasing a chalcogenide variable resistance memory cell is provided. The chalcogenide variable resistance memory cell includes a p-doped substrate with an n-well and a chalcogenide variable resistance memory element. The method includes the step of applying to the chalcogenide variable resistance memory element a voltage that is less than a fixed voltage of the substrate. The applied voltage induces an erase current to flow from the substrate through the n-well and through the chalcogenide variable resistance memory element. The voltage may be applied to a single chalcogenide variable resistance memory cell, or to an array of chalcogenide variable resistance memory cells, resulting in the erasure of the entire array. The voltage may be applied periodically in order to reset the chalcogenide variable resistance memory cells, or it may be applied only upon power-up or power-down operations. The voltage may also be applied to chalcogenide variable resistance memory cells whose voltage-resistance curves have shifted below a minimum erasure resistance level. When the voltage is applied, the substrate acts as a diode when current flows across the substrate, thus making the resistance across the substrate independent of the resistance across the chalcogenide variable resistance memory elements.

In other embodiments of the invention, a chalcogenide variable resistance memory device, an array of chalcogenide variable resistance memory devices, and a processing system that includes at least one array of chalcogenide variable resistance memory devices are provided. The chalcogenide variable resistance memory devices are such that the application, to the chalcogenide variable resistance memory element, of a voltage that is less than a fixed voltage of the substrate induces an erase current to flow from the substrate through the chalcogenide variable resistance memory element.

These and other aspects of the invention will be more clearly recognized from the following detailed description of the invention which is provided in connection with the accompanying drawings.

DETAILED DESCRIPTION OF THE INVENTION

In the following detailed description, reference is made to various specific structural and process embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

Figure 1:
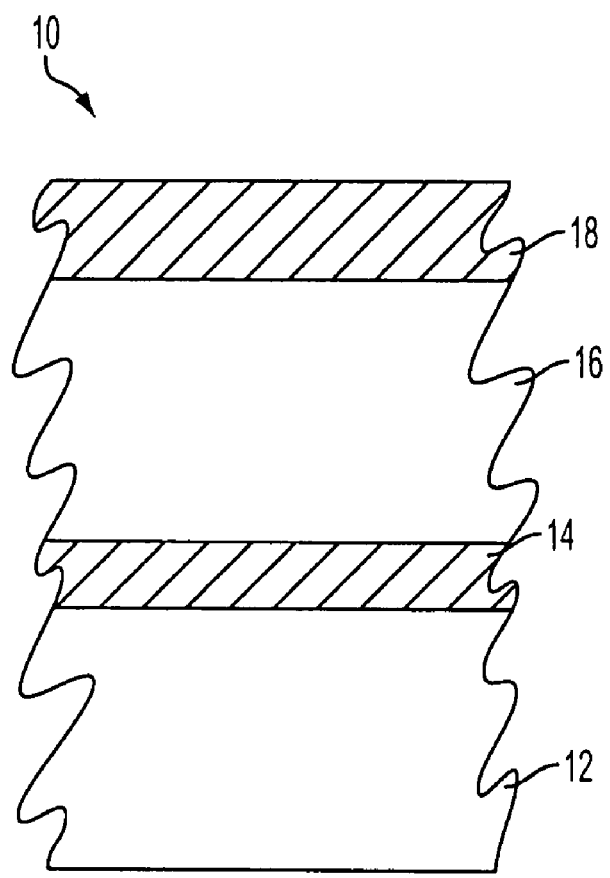
FIG. 1 shows a basic composition of a prior art variable resistance memory cell.
Figure 2:
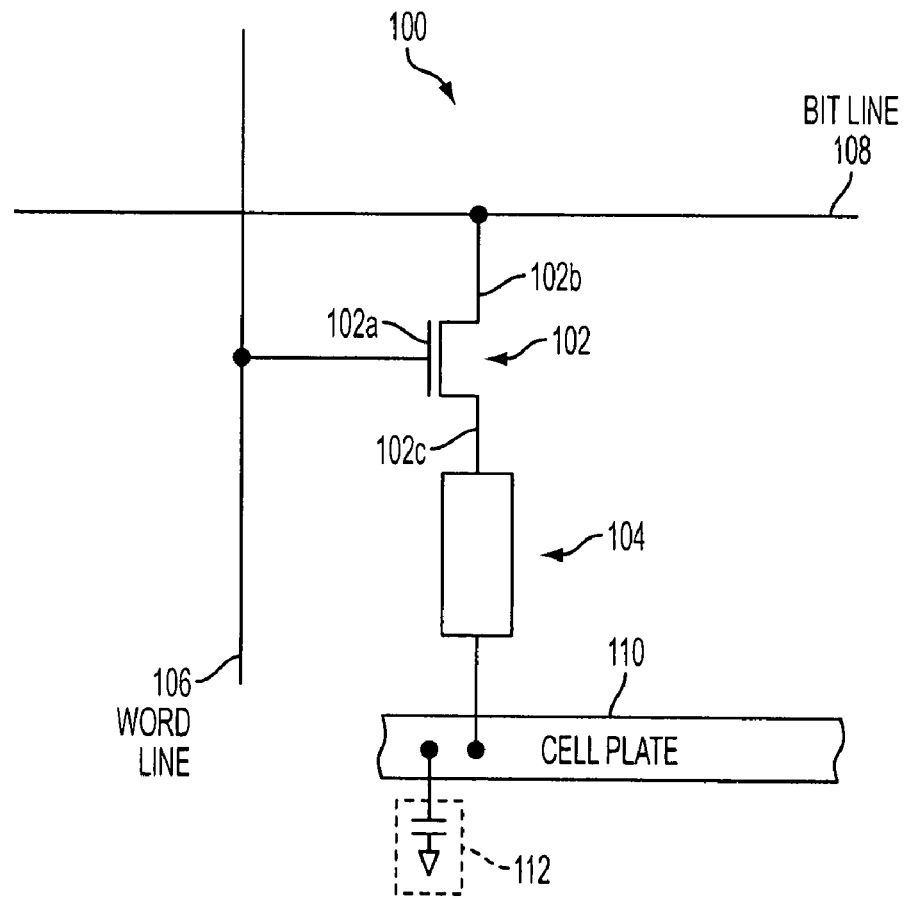
FIG. 2 is a prior art variable resistance memory cell with access device.
Figure 3:
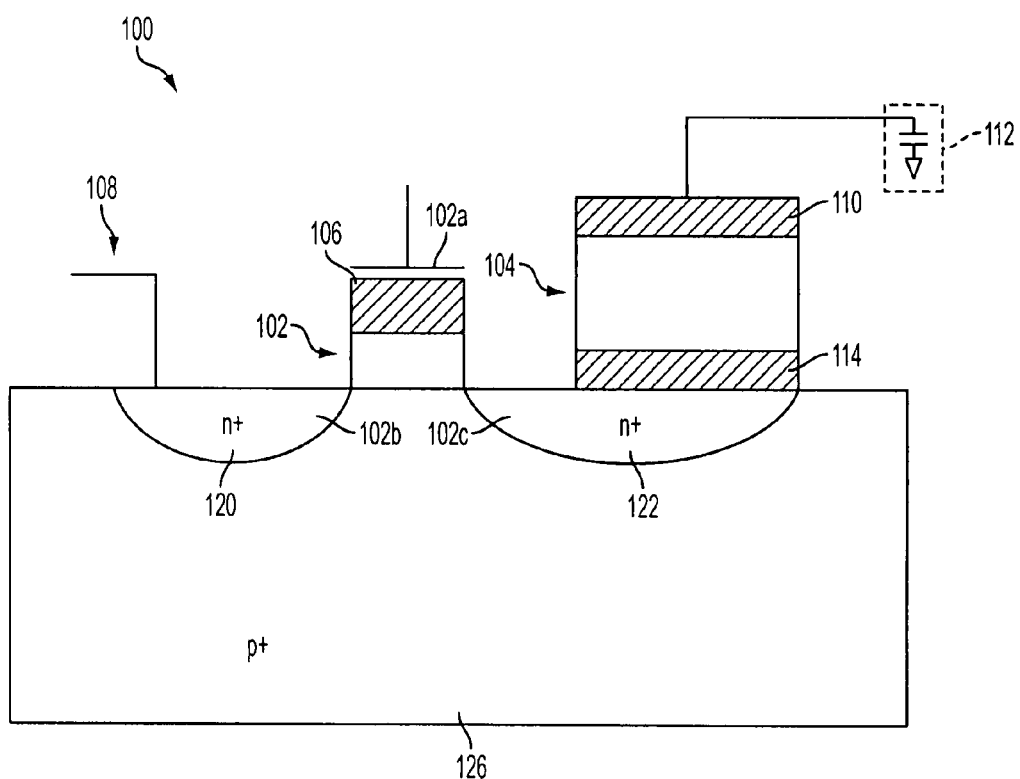
FIG. 3 shows the physical structure of a prior art variable resistance memory cell.

According to the invention, a chalcogenide variable resistance memory cell is subject to an erase operation. In order to erase a chalcogenide variable resistance memory cell, such as that shown in FIG. 3, a voltage differential must be created across the chalcogenide variable resistance memory element 104 to induce a current capable of changing the resistance of the chalcogenide variable resistance memory element 104. Traditionally, as explained above, the necessary erasing current has been generated by raising the voltage potential of bit line 108 to a level higher than the voltage potential of cell plate 110. Then, when word line 106 was activated, thus activating the access device 102, an erase current would flow through the access device 102 and the chalcogenide variable resistance memory element 104 from bit line 108 to cell plate 110. However, the inventor has determined that if, as is described below, current were to flow instead from and through the substrate 126 to the cell plate 110, the prior art voltage-divider problem would be avoided.

Figure 10B:
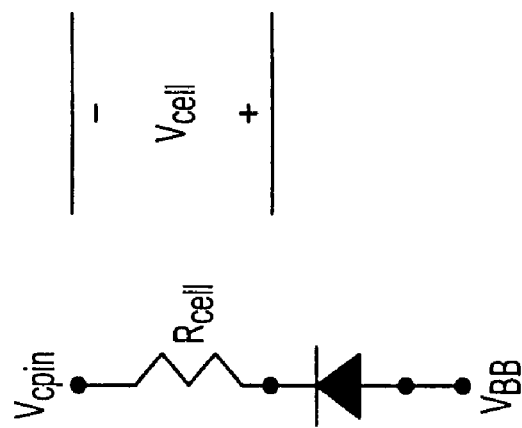
FIGS. 10A and 10B show a chalcogenide variable resistance memory cell constructed in accordance with an exemplary embodiment of the invention.
Figure 10A:
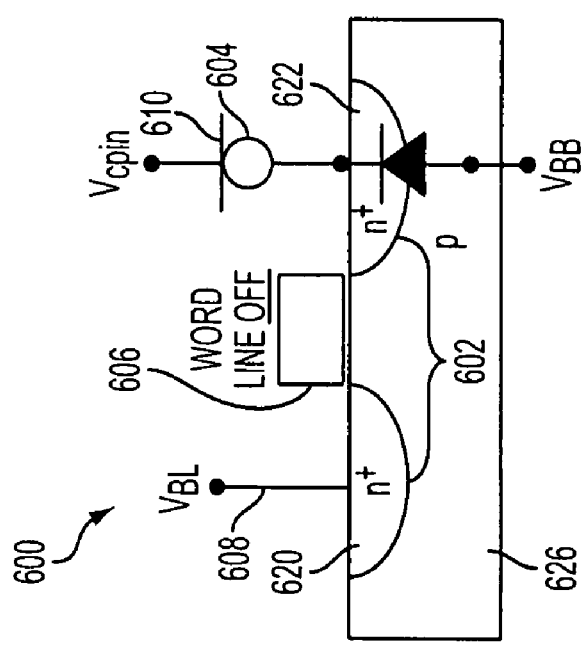

Referring now to FIG. 10A, wherein a chalcogenide variable memory cell 600 is shown, an embodiment of the invention is depicted. As in the traditional chalcogenide variable resistance memory devices, the chalcogenide variable memory cell 600 includes a p-doped substrate 626, two n-wells 620, 622, and an access device 602 or transistor whose gate is connected to a word line 606, whose source is connected to a bit line 608, and whose drain is connected to the chalcogenide variable resistance memory element 604. A voltage, $V_{BB}$, is shown, representing the fixed voltage of the substrate 626. If the cell plate 610 voltage, $V_{cpin}$, is lowered to a level that is less than $V_{BB}$, and if the word line 606 is maintained in an "off" state, then a current may be induced to flow from the substrate 626 to the cell plate 610 and through the chalcogenide variable resistance memory element 604. This current, if strong enough, could effectuate an erase operation.

When current flows from the p-doped substrate 626 to the cell plate 610, the current necessarily passes through the n-well 622 acting as a drain for the access device 602. The resulting p-n junction behaves as a diode. Thus, instead of the erase current flowing through two series resistances, the erase current flows through a forward-biased diode and one resistance, $R_{cell}$ (refer to FIG. 10B). Voltage drops across forward-biased diodes are relatively constant (usually around 0.7 V), and thus the voltage drop across the chalcogenide variable resistance memory element 604 will simply equal the difference between the $V_{BB}$–$V_{cpin}$ differential and the voltage across the diode, $V_{diode}$. This relationship is shown below in Equation 2.

$$V_{cell} = V_{BB} - V_{cpin} - V_{diode} \qquad \text{Eq. 2}$$

$V_{cpin}$ is easily adjusted in order to obtain the desired $V_{cell}$. Additionally, because of the relative constancy of $V_{diode}$, $V_{cell}$ is independent of $R_{cell}$.

Figure 4:
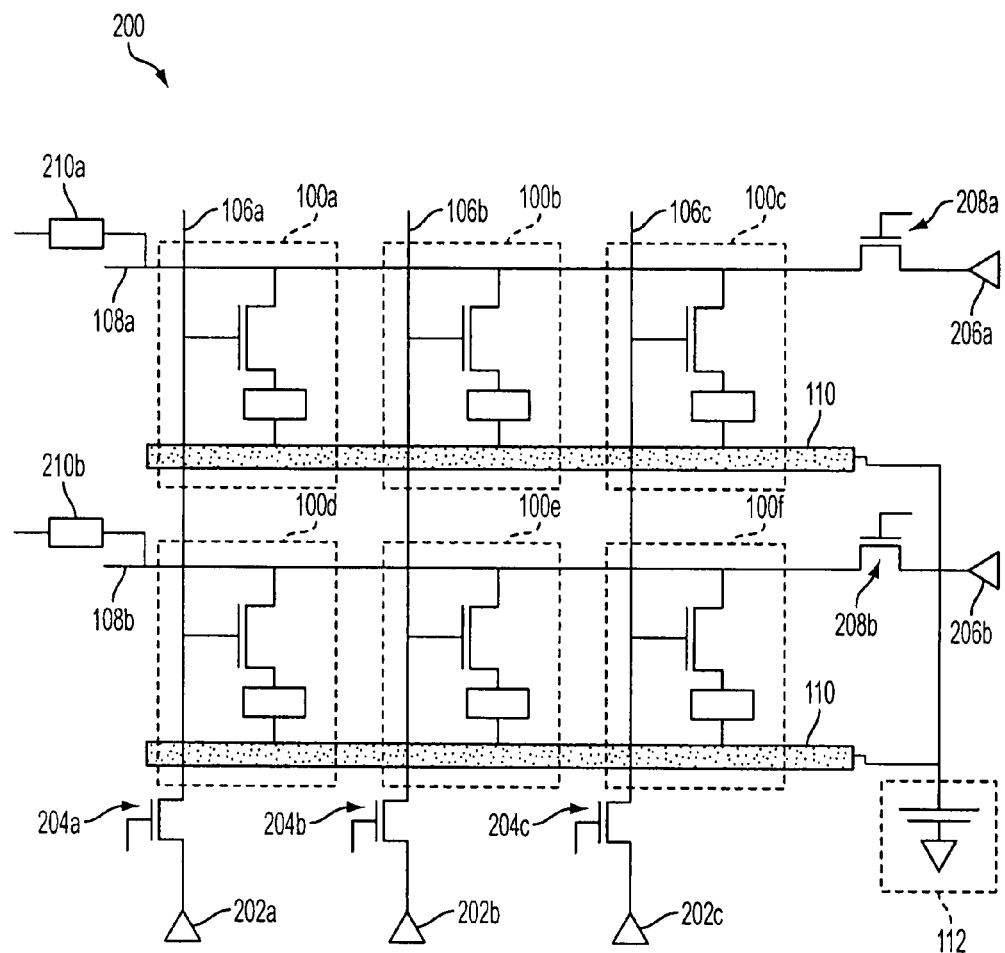
FIG. 4 is a prior art memory device comprising variable resistance memory cells.
Figure 5A:
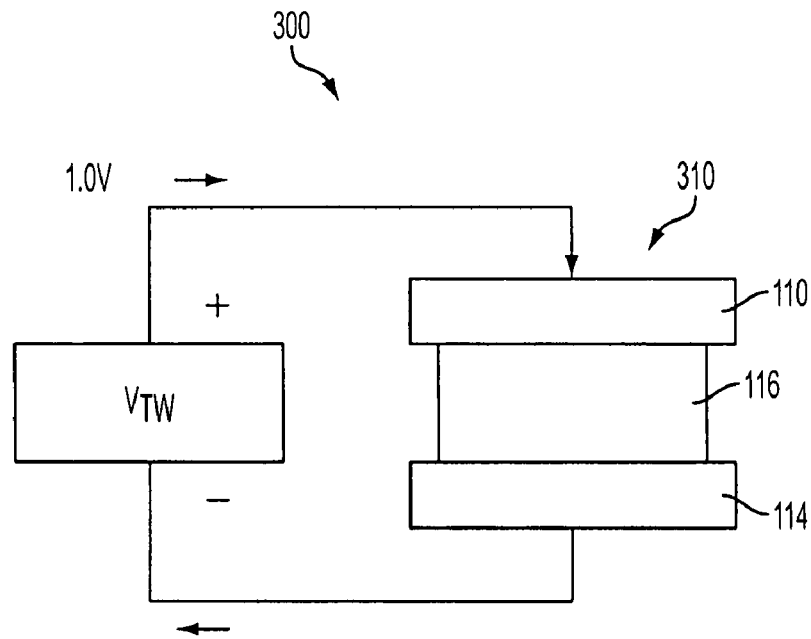
FIGS. 5A and 5B are illustrations of prior art chalcogenide variable resistance memory programming circuits.
Figure 5B:
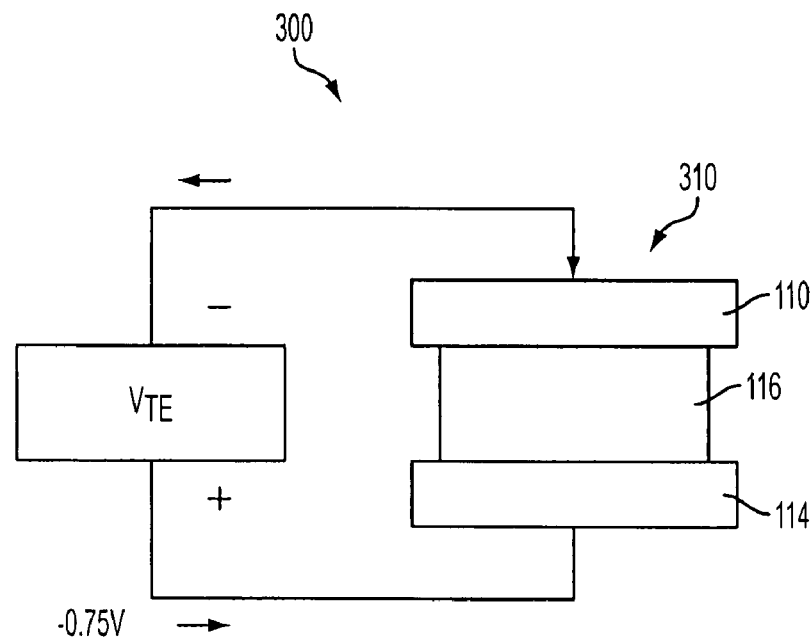
Figure 6A:
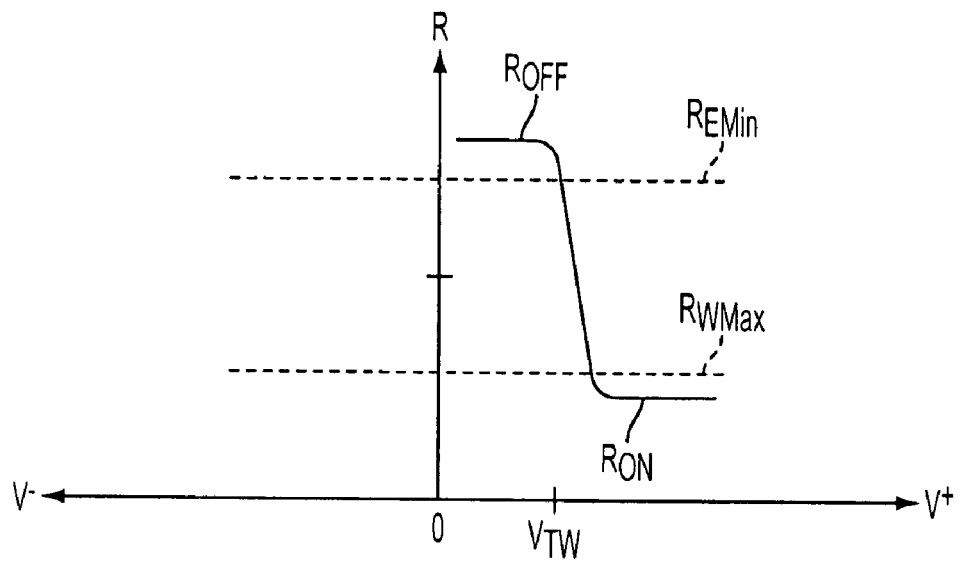
FIGS. 6A and 6B are illustrations of standard voltage-resistance curves for a chalcogenide variable resistance memory cell.
Figure 6B:
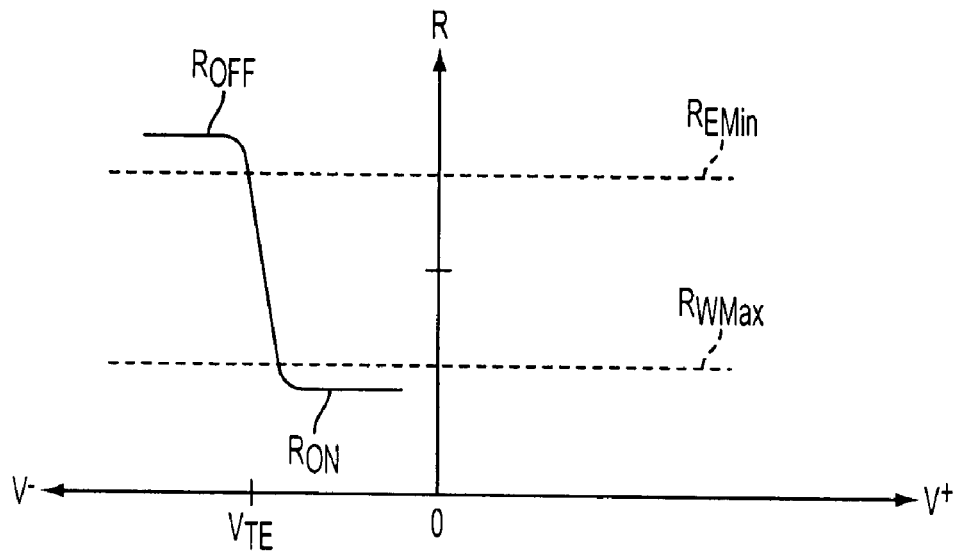

The above-described embodiment of the invention may be used to simultaneously perform erase operations on multiple or even all memory cells in a memory array such as that shown in FIG. 4. For each chalcogenide variable resistance memory cell in the array, $V_{BB}$ is the same. $V_{cpin}$ is lowered to a voltage level less than $V_{BB}$ for each chalcogenide variable resistance memory cell that is to be erased. Single memory cells may be erased. More commonly, entire rows or even blocks of memory cells may be erased. If desired the entire array of memory cells may be erased simultaneously.

Figure 7:
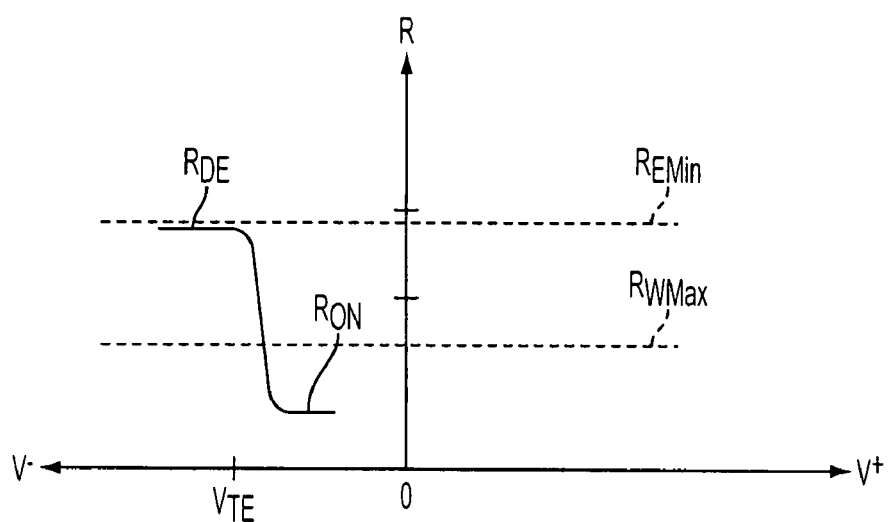
FIG. 7 is an illustration of a shifted voltage-resistance curve for a chalcogenide variable resistance memory cell.
Figure 8A:
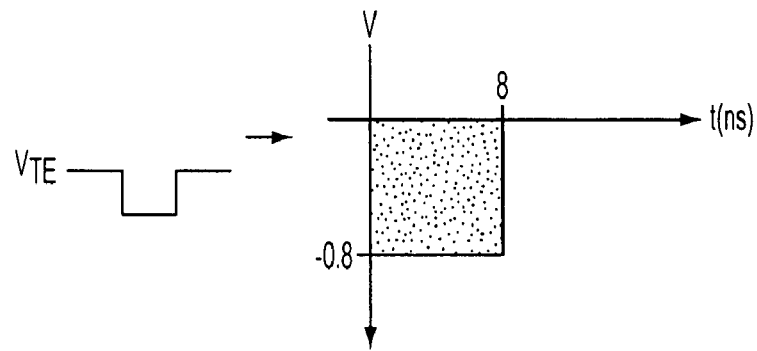
FIGS. 8A, 8B and 8C are illustrations of erase pulses for a chalcogenide variable resistance memory cell.
Figure 8B:
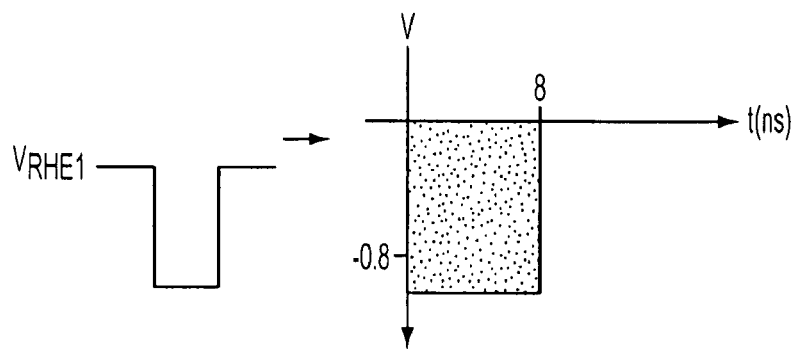
Figure 8C:
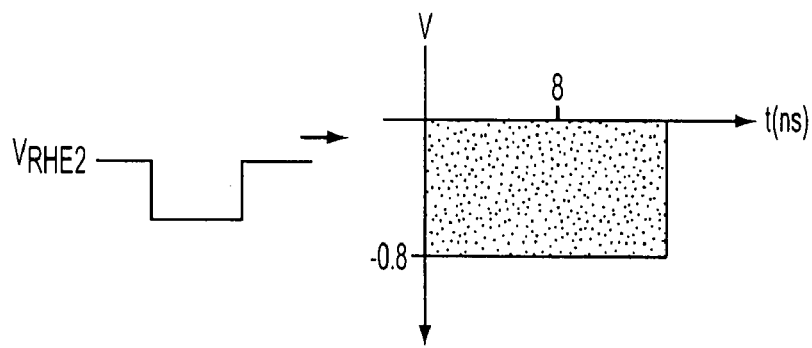
Figure 9C:
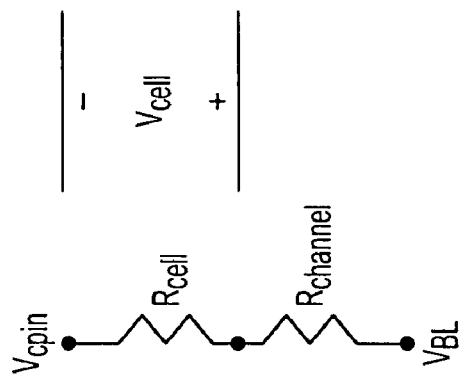
FIGS. 9A, 9B and 9C show an access device with a chalcogenide variable resistance memory cell illustrating a voltage divider circuit.
Figure 9B:
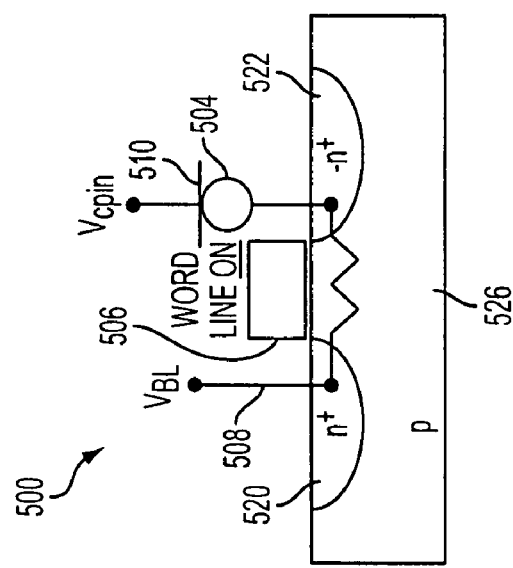
Figure 9A:
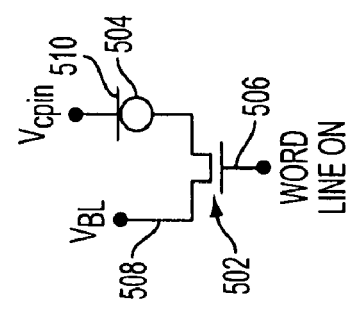

In one embodiment of the invention, the described erase method is used as a standard full array erase operation every time an erase operation is necessary. In another embodiment of the invention, the erase method is used to reset the resistances of the chalcogenide variable resistance memory cells periodically, for example, every 10 or 100 memory cycles, wherein a memory cycle is the amount of time required for a memory to complete a read or write operation. Furthermore, the erase method could be used on power-up or power-down of a memory array. Additionally, the erase method could be used on individual chalcogenide variable resistance memory cells in order to repair (via an erase operation) memory cells whose measured voltage-resistance curves have drifted out of the range in which a traditional erase operation is effective. In theory, the voltage/resistance curves of each cell could be measured by measuring the resistance of the cells as a function of applied voltage for a given current. However, in practice, it may be assumed that the voltage/resistance curve for a given memory cell has slipped below a threshold minimal erase level (as demonstrated in FIG. 7) when the cell no longer responds to other proposed erase methods (such as the method of FIG. 9). If a non-responsive memory cell is observed via parity checking or other error-revealing methods, then either the one non-responsive memory cell or an entire block of memory cells that contains the non-responsive memory cell may be erased and reset using the disclosed erase method.

Figure 11:
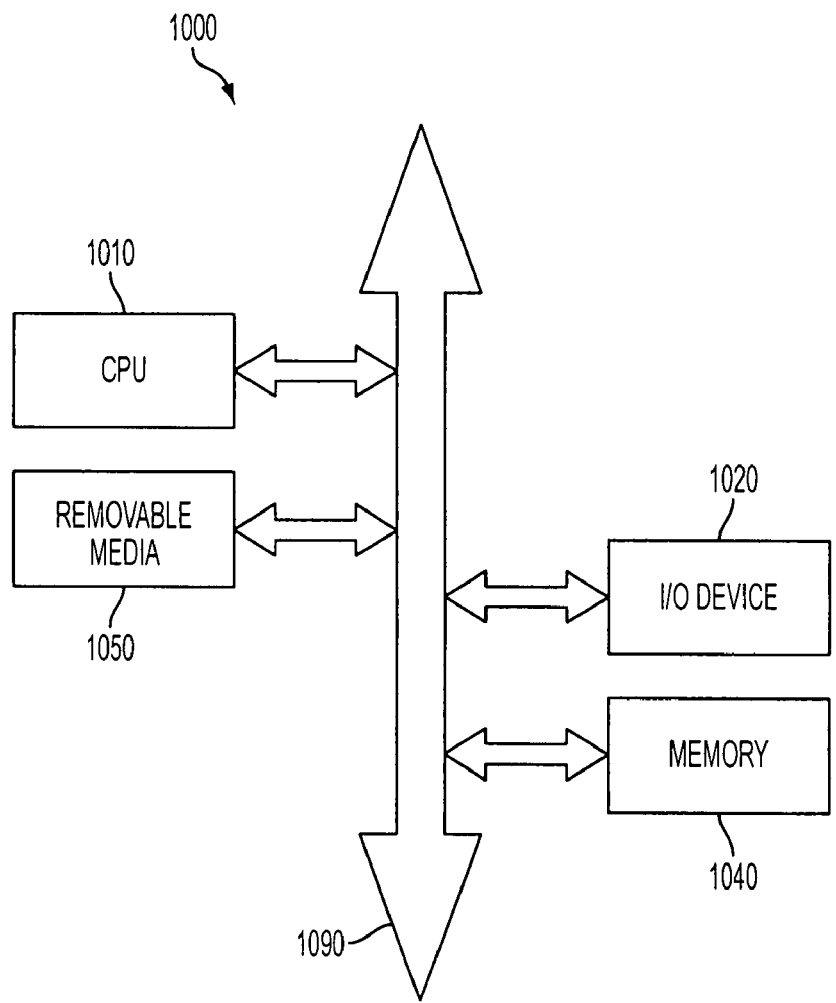
FIG. 11 is a processor system incorporating chalcogenide variable resistance memory cells, in accordance with an exemplary embodiment of the invention.

FIG. 11 illustrates a typical processor system 1000 which includes a memory circuit 1040 such as a chalcogenide variable resistance memory device, which employs chalcogenide variable resistance memory cells fabricated in accordance with the invention. A processor system, such as a computer system, generally comprises a central processing unit (CPU) 1010, such as a microprocessor, a digital signal processor, or other programmable digital logic devices, which communicates with an input/output (I/O) device 1020 over a bus 1090. The memory circuit 1040 communicates with the CPU 1010 over bus 1090 typically through a memory controller.

In the case of a computer system, the processor system may include peripheral devices such as removable media devices 1050 which communicate with CPU 1010 over the bus 1090. Memory circuit 1040 is preferably constructed as an integrated circuit, which includes one or more resistance variable memory devices. If desired, the memory circuit 1040 may be combined with the processor, for example CPU 1010, in a single integrated circuit.

The above description and drawings should only be considered illustrative of exemplary embodiments that achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letter Patent of the U.S. is:

1. A method of erasing a chalcogenide variable resistance memory cell which includes at least a chalcogenide variable resistance memory element formed over a doped substrate of a first conductivity type, said doped substrate containing a well of a second conductivity type, the method comprising:
    applying to the chalcogenide variable resistance memory element a voltage that is less than a fixed voltage of the substrate to thereby induce an erase current to flow through the substrate and contained well and through the chalcogenide variable resistance memory element,
    wherein the chalcogenide variable resistance memory cell further includes an access device which is not active when said erase current is induced.

2. The method of claim 1, wherein the first conductivity type is p-type, and the second conductivity type is n-type.

3. The method of claim 1, wherein the applied voltage is applied to an array of chalcogenide variable resistance memory cells.

4. The method of claim 1, wherein the applied voltage is applied periodically in order to reset the chalcogenide variable resistance memory cell.

5. The method of claim 1, wherein the applied voltage is applied at memory power-up or power-down in order to reset the chalcogenide variable resistance memory cell.

6. The method of claim 1, wherein the applied voltage is applied to a chalcogenide variable resistance memory cell whose voltage/resistance curve has shifted below a minimum erasure resistance level.

7. A chalcogenide variable resistance memory device comprising:
    a p-doped substrate containing an n-well; and
    a memory cell comprising:
        a chalcogenide variable resistance memory element over said substrate; and
        a circuit for inducing refresh currents in said variable resistance memory element, said circuit being selectively operative to apply to the chalcogenide variable resistance memory element a voltage that is less than a fixed voltage of the substrate and induce an erase current to flow from the substrate through the contained n-well and through the chalcogenide variable resistance memory element,
    wherein the memory cell further comprises an access device which is not active when the erase current is induced.

8. The chalcogenide variable resistance memory device of claim 7, wherein the chalcogenide variable resistance memory element is a metal ion doped chalcogenide glass.

9. The chalcogenide variable resistance memory device of claim 7, wherein the chalcogenide variable resistance memory element is a geranium-selenide glass.

10. The chalcogenide variable resistance memory device of claim 9, wherein the geranium-selenide glass has a stoichiometry of $Ge_xSe_{(100-x)}$, where x ranges from 20 to 43.

11. The chalcogenide variable resistance memory device of claim 7, wherein the applied voltage is applied periodically in order to reset the memory cell.

12. The chalcogenide variable resistance memory device of claim 7, wherein the applied voltage is applied at memory power-up or power-down in order to reset the memory cell.

13. The chalcogenide variable resistance memory device of claim 7, wherein the voltage/resistance curve of the memory cell has shifted below a minimum erasure resistance level.

14. An array of chalcogenide variable resistance memory devices, comprising:
   a p-doped substrate containing an n-well; and
   a plurality of memory devices, each comprising:
      a chalcogenide variable resistance memory element over said substrate; and
      a circuit for inducing refresh currents in said variable resistance memory element, said circuit being selectively operative to apply to the chalcogenide variable resistance memory element a voltage that is less than a fixed voltage of the substrate and induce an erase current to flow from the substrate through the contained n-well and through the chalcogenide variable resistance memory element;
   wherein the plurality of memory devices are arranged over the substrate in rows and columns, wherein
   each row of memory devices is connected along a respective bit line and each column of memory devices is connected along a respective word line, and
   wherein the memory devices further comprise access devices which are not active when the erase current is induced.

15. The array of claim 14, wherein the chalcogenide variable resistance memory element is a metal ion doped chalcogenide glass.

16. The array of claim 14, wherein the chalcogenide variable resistance memory element is a geranium-selenide glass.

17. The array of claim 16, wherein the geranium-selenide glass has a stoichiometry of $Ge_xSe_{(100-x)}$, where x ranges from 20 to 43.

18. The array of claim 14, wherein the applied voltage is applied to the array of memory devices.

19. The array of claim 14, wherein the applied voltage is applied periodically in order to reset at least one of the memory devices in the array.

20. The array of claim 14, wherein the applied voltage is applied at memory power-up or power-down in order to reset at least one of the memory devices in the array.

21. The array of claim 14, wherein the applied voltage is applied to at least one of the memory devices in the array whose voltage/resistance curve has shifted below a minimum erasure resistance level.

22. A processing system, comprising:
   a processor for receiving and processing data;
   at least one memory array for exchanging data with the processor; and
   a memory controller for managing memory access requests from the processor to the at least one memory array,
   wherein each of the at least one memory array includes:
      a p-doped substrate containing an n-well; and
      a plurality of memory devices, each comprising:
         a chalcogenide variable resistance memory element over said substrate; and
         a circuit for inducing refresh currents in said variable resistance memory element, said circuit being selectively operative to apply to the chalcogenide variable resistance memory element a voltage that is less then a fixed voltage of the substrate and induce an erase current to flow from the substrate through the contained n-well and through the chalcogenide variable resistance memory element; wherein
   the plurality of memory devices are arranged over the substrate in rows and columns, wherein each row of memory devices is connected along a respective bit line and each column of memory devices is connected along a respective word line, and
   wherein the memory devices further comprise access devices which are not active when the erase current is induced.

23. The processing system of claim 22, wherein the chalcogenide variable resistance memory element is a metal ion doped chalcogenide glass.

24. The processing system of claim 22, wherein the chalcogenide variable resistance memory element is a geranium-selenide glass.

25. The processing system of claim 24, wherein the geranium-selenide glass has a stoichiometry of $Ge_xSe_{(100-x)}$, where x ranges from 20 to 43.

26. The processing system of claim 22, wherein the applied voltage is applied to the at least one array of memory devices.

27. The processing system of claim 22, wherein the applied voltage is applied periodically in order to reset at least one of the memory devices in the at least one array.

28. The processing system of claim 22, wherein the applied voltage is applied at memory power-up or power-down in order to reset at least one of the memory devices in the at least one array.

29. The processing system of claim 22, wherein the applied voltage is applied to at least one of the memory devices in the at least one array whose voltage/resistance curve has shifted below a minimum erasure resistance level.

* * * * *